(12) United States Patent
Yi et al.

(10) Patent No.: US 9,025,713 B2
(45) Date of Patent: May 5, 2015

(54) METHOD FOR PORTABLE DEVICE PROCESSING DATA BASED ON CLOCK EXTRACTED FROM DATA FROM HOST

(71) Applicant: M31 Technology Corporation, Hsinchu County (TW)

(72) Inventors: Yu-Sheng Yi, Hsinchu County (TW); Ting-Chun Huang, Taipei (TW); Yuan-Hsun Chang, Hsinchu County (TW)

(73) Assignee: M31 Technology Corporation, Hsinchu County (TW)

( * ) Notice: Subject to any disclaimer, the term of this patent is extended or adjusted under 35 U.S.C. 154(b) by 0 days.

(21) Appl. No.: 14/045,819

(22) Filed: Oct. 4, 2013

(65) Prior Publication Data

US 2015/0098542 A1 Apr. 9, 2015

(51) Int. Cl.
*H04L 7/00* (2006.01)
*H04L 7/033* (2006.01)

(52) U.S. Cl.
CPC ............ *H04L 7/0025* (2013.01); *H04L 7/0331* (2013.01)

(58) Field of Classification Search
CPC ..... H04L 7/0025; H04L 7/0331; H04L 7/033; H04L 25/0272; H04L 1/242; H04L 25/0266; H04L 25/0274; H04L 25/0278; H04L 25/028; H04L 25/0282; H04L 25/0286; H04L 25/0292; H04L 25/0294; H04L 25/05
See application file for complete search history.

(56) References Cited

U.S. PATENT DOCUMENTS

| | | | |
|---|---|---|---|
| 8,451,971 B2 | 5/2013 | Chao et al. | |
| 2005/0063494 A1 | 3/2005 | Gregorius et al. | |
| 2006/0023824 A1* | 2/2006 | Greco et al. | 375/371 |
| 2006/0242346 A2* | 10/2006 | Vuong | 710/302 |
| 2008/0152024 A1* | 6/2008 | Takeuchi | 375/257 |
| 2009/0103604 A1* | 4/2009 | Xiu et al. | 375/240.01 |
| 2009/0296869 A1 | 12/2009 | Chao et al. | |
| 2009/0296870 A1 | 12/2009 | Chao et al. | |
| 2011/0110474 A1* | 5/2011 | Sato et al. | 375/371 |
| 2011/0311012 A1 | 12/2011 | Chen et al. | |
| 2012/0223750 A1 | 9/2012 | Zhao | |
| 2013/0069700 A1* | 3/2013 | Wang et al. | 327/157 |
| 2013/0322462 A1* | 12/2013 | Poulsen | 370/458 |

* cited by examiner

*Primary Examiner* — Hirdepal Singh
(74) *Attorney, Agent, or Firm* — Erica Lin; Cometrue Inc.

(57) ABSTRACT

A method for a first electronic device processing data based on information from a second electronic device may comprise: receiving a first signal from the second electronic device; extracting a first clock based on the first signal; adjusting an oscillator based on the first clock so as to generate a second clock; and selecting one from the first and second clocks. In an embodiment of the present invention, the first electronic device may be configured to be hot plugged into the second electronic device. The method may further comprise processing a data stream from the second electronic device based on said selecting said one from the first and second clocks. The method may further comprise transmitting a data stream to the second electronic device based on said selecting said one from the first and second clocks.

20 Claims, 12 Drawing Sheets

METHOD FOR PORTABLE DEVICE PROCESSING DATA BASED ON CLOCK EXTRACTED FROM DATA FROM HOST

BACKGROUND OF THE DISCLOSURE

1. Field of the Disclosure

The disclosure relates to a method for an electronic portable device processing data based on information from an electronic host device, and more particularly, to a method for an electronic portable device processing data based on a clock extracted from data from an electronic host device.

2. Brief Description of the Related Art

An electronic portable device can be hot-plugged into an electronic host device so as to transmit data to the electronic host device based on a reference clock. The electronic portable device may include a crystal to generate the reference clock used for transceiving and processing data. The electronic portable device may include a phase lock loop (PLL) unit employing the reference clock as an input to generate a PLL clock having a frequency equal to a multiple of that of the reference clock. The PLL clock can be employed as a reference clock for a clock data recovery of the electronic portable device to obtain a retimed data stream. Further, the PLL clock may be employed as a reference clock for the electronic portable device to transmit a data stream to the electronic host device.

Even though the crystal may provide the reference clock with an accurate frequency for serving as an ideal clock source, the crystal typically costs a lot and occupies a relatively large space of a circuit board.

SUMMARY OF THE DISCLOSURE

The present invention provides a method for a first electronic device, such as electronic portable device, processing data based on information from a second electronic device, such as electronic host device, and a data transceiver. Even if a crystal is saved in the electronic portable device, the electronic portable device may generate an accurate clock.

The method may comprise: receiving a first signal from the second electronic device; extracting a first clock based on the first signal; adjusting an oscillator based on the first clock so as to generate a second clock; and selecting one from the first and second clocks.

In an embodiment of the present invention, the first electronic device may be configured to be hot plugged into the second electronic device. The method may further comprise processing a data stream from the second electronic device based on said selecting said one from the first and second clocks. The method may further comprise transmitting a data stream to the second electronic device based on said selecting said one from the first and second clocks. After said adjusting the oscillator, the method may further comprise entering into a power saving mode, followed by said selecting the second clock.

In an embodiment of the present invention, said adjusting the oscillator may comprise replacing a resistor for the oscillator. Said adjusting the oscillator may comprise the oscillator generating a third clock based on a first code, counting a first number of samples in an interval of time based on the third clock, the oscillator generating a fourth clock based on a second code, counting a second number of samples in the interval of time based on the fourth clock, obtaining a ratio of a difference of the second number minus the first number to a difference of the second code minus the first code, counting a third number of samples in the interval of time based on the first clock, and calculating a third code based on the ratio, the second code, the second number and the third number. Said adjusting the oscillator may further comprise generating multiple pulses with substantially the same pulse width, wherein the interval of time is equal to the time of the pulse width. Said adjusting the oscillator may further comprise generating a fifth clock based on the third code, counting a fourth number of samples in the interval of time based on the fifth clock, and generating a fourth code based on the third code, the ratio and the third and fourth number.

In an embodiment of the present invention, before said receiving the first signal, the method may further comprise receiving a second signal at a sixth clock, with a frequency less than that of the first clock, from the second electronic device and transmitting a third signal at a seventh clock, with a frequency less than that of the first clock, to the second electronic device. After said extracting the first clock, the method may further comprise compensating the second signal to an internal controller of the first electronic device.

In an embodiment of the present invention, the method may further comprise processing a first data stream from the second electronic device based on said selecting said one from the first and second clocks and transmitting a second data stream to the second electronic device based on said selecting said one from the first and second clocks.

Alternatively, a data receiver or transceiver may comprise a clock and data recovery (CDR) circuit configured to generate a first clock; a first oscillator configured to generate a second clock adjusted based on said first clock; and a first multiplexer coupled downstream of the CDR circuit and the first oscillator, wherein the first multiplexer is configured to generate a third clock based on said first or second clock.

In an embodiment of the present invention, the data transceiver may comprise a phase lock loop (PLL) coupled to and downstream of the first multiplexer, wherein the phase lock loop is configured to generate a fourth clock having a frequency equal to a multiple of that of the third clock. The first oscillator may be configured to generate the second clock adjusted based on the fourth clock when the third clock is generated by the first multiplexer based on the first clock. The first oscillator may be configured to generate the second clock adjusted based on the first clock.

In an embodiment of the present invention, the structure may further comprise an equalizer coupled to and upstream of the CDR circuit, wherein the equalizer is configured to equalize a first signal from the second electronic device based on a parameter, and an eye monitor having an input at an output of the equalizer, wherein the eye monitor is configured to monitor the output of the equalizer and generate a second signal to alter the parameter.

In an embodiment of the present invention, the CDR circuit may comprise a second oscillator configured to generate the first clock, a frequency detector having a first input at an output of the second oscillator and a second input at the output of the equalizer, wherein the first frequency detector is configured to compare a frequency of the first input of the frequency detector and that of the second input of the frequency detector, and a phase detector having a first input at the output of the second oscillator and a second input at the output of the equalizer, wherein the first phase detector is configured to compare a phase of the first input of the phase detector and that of the second input of the phase detector. The CDR circuit may further a phase-and-frequency detector having a first input at the output of the second oscillator and a second input at an output of the first oscillator, wherein the phase-and-frequency detector is configured to compare a phase and frequency of the first input of the phase-and-frequency detector and those of the second input of the phase-and-frequency detector. The CDR circuit may further comprise a second multiplexer coupled to an output of the frequency detector, an output of the phase-and-frequency detector and an output of the phase detector, wherein the second multiplexer is configured to select one of the outputs of the frequency detector, the phase-and-frequency detector and the phase detector.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1:
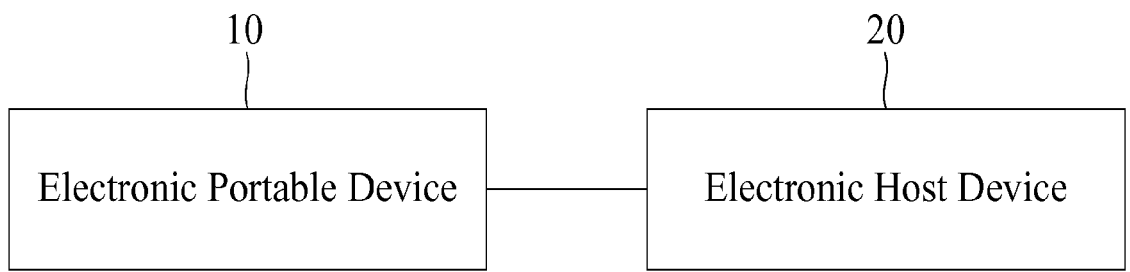
FIG. 1 illustrates a structure of an electronic portable device hot-plugged into an electronic host device in accordance with the present invention.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

FIG. 1 illustrates a structure of an electronic portable device hot-plugged into an electronic host device in accordance with the present invention. Referring to FIG. 1, an electronic portable device 10, such as portable storage device, smart phone or mobile phone, may be hot-plugged into an electronic host device 20, such as laptop or notebook computer or desktop computer.

Figure 2A:
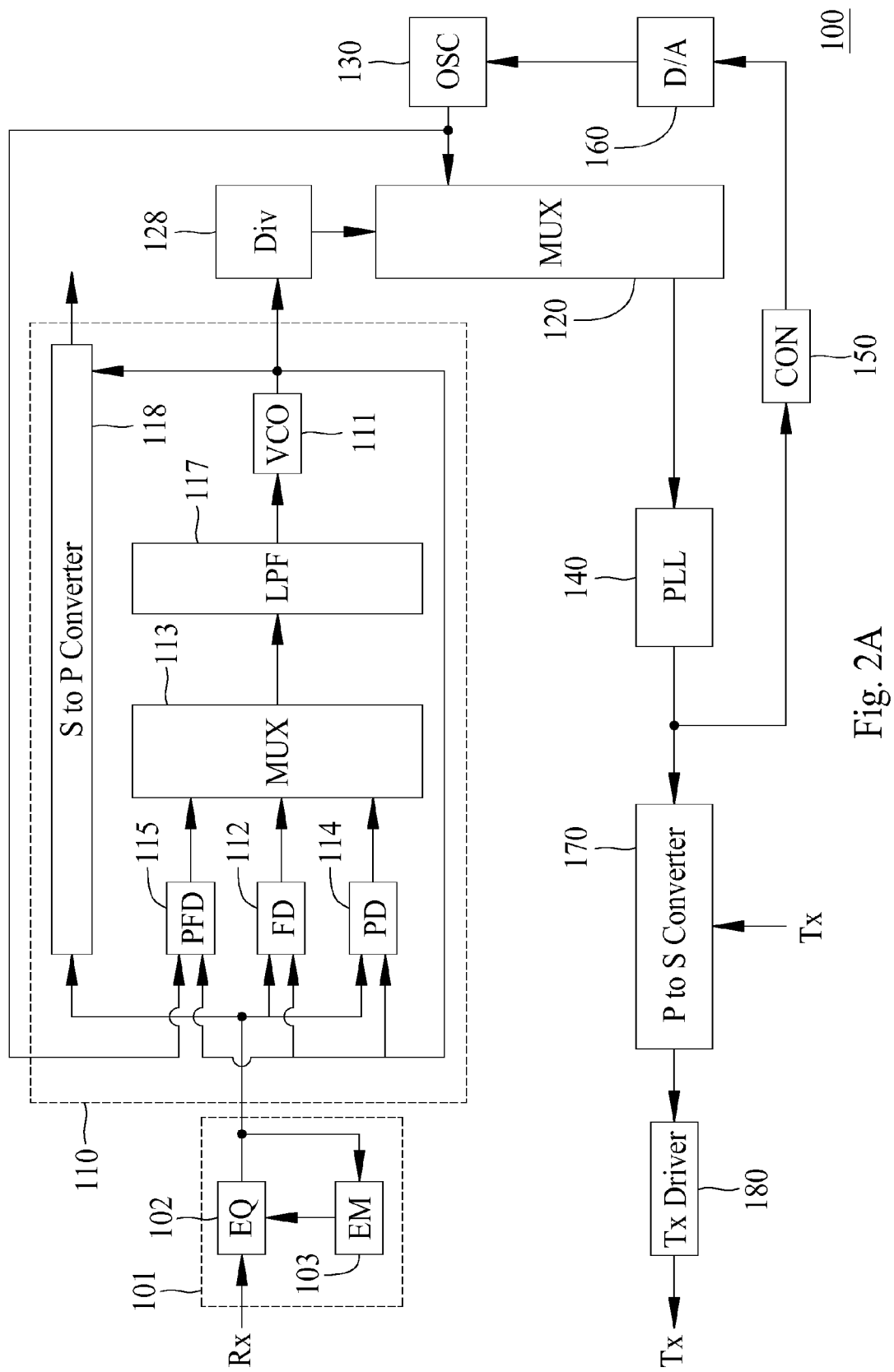
FIG. 2A illustrates a structure of a data transceiver of the electronic portable device in accordance with a first embodiment of the present invention.

FIG. 2A illustrates a structure of a data transceiver of the electronic portable device in accordance with a first embodiment of the present invention. Referring to FIGS. 1 and 2, the data transceiver 100 of the electronic portable device 10 may include a signal conditioning circuit 101 configured to condition a signal received by the electronic portable device 10. The signal conditioning circuit 101 may include an equalizer (EQ) 102 configured to equalize a signal or a serial data stream in a digital format received by the electronic portable device 10 and an eye monitor (EM) 103 coupled to an output of the equalizer 102 and configured to monitor an eye diagram of the received signal or data stream. During an equalization and optimization process, the equalizer 102 is configured to equalize the received signal or data stream, i.e. multiply or weigh the received signal or data stream by a weighting or parameter, if the eye diagram is not open, until the eye diagram is optimized. During an equalization and optimization process, the weighting or parameter may be altered based on a signal from the eye monitor 103. Accordingly, the equalizer 102 can compensate intersymbol interference (ISI) of the received signal or data stream. On the contrary, the equalizer 102 is configured not to equalize the received signal or data stream, if the eye diagram is open, that is, the eye diagram has an eye width greater than a predetermined eye width and an eye height greater than a predetermined eye height, for example.

Referring to FIG. 2A, the data transceiver 100 may include a clock and data recovery (CDR) circuit 110 arranged downstream of and coupled to an output of the equalizer 102 of the signal conditioning circuit 101. The CDR circuit 110 may extract a track clock based on a base frequency of the received signal or data stream. The CDR circuit 110 may include a voltage-controlled oscillator (VCO) 111 configured to generate the track clock to a divider (Div) 128 of the data transceiver 100. Alternatively, the voltage-controlled oscillator (VCO) 111 may be replaced with a current-controlled oscillator (ICO). The CDR circuit 110 may include a frequency detector (FD) 112 configured to compare the frequency of a clock from the voltage-controlled oscillator (VCO) 111 and that of the received signal or data stream from the signal conditioning circuit 101 so as to generate the frequency-compared result to a multiplexer (MUX) 113 of the CDR circuit 110. The CDR circuit 110 may include a phase detector (PD) 114 configured to compare the phase of a clock from the voltage-controlled oscillator (VCO) 111 and that of the received signal or data stream from the signal conditioning circuit 101 so as to generate the phase-compared result to the multiplexer (MUX) 113. The CDR circuit 110 may include a phase-and-frequency detector (PFD) 115 configured to compare the phase and frequency of a clock from the voltage-controlled oscillator (VCO) 111 and those of an internal clock from a voltage-controlled oscillator (VCO) 130, referred to as an internal oscillator hereinafter, of the data transceiver 100 so as to generate the phase-and-frequency-compared result to the multiplexer (MUX) 113. Alternatively, the voltage-controlled oscillator (VCO) 130 may be replaced with a current-controlled oscillator (ICO).

Referring to FIG. 2A, the multiplexer (MUX) 113 may select one of the compared results from the frequency detector (FD) 112, the phase detector (PD) 114 and the phase-and-frequency detector 115 so as to generate a selected signal to a low-pass filter (LPF) 117 of the CDR circuit 110. The low-pass filter (LPF) 117 is configured to attenuate (reduce the amplitude of) the selected signal with frequencies higher than a cutoff frequency so as to generate an attenuated signal. Thereby, a clock, e.g. track clock, can be generated by the voltage-controlled oscillator (VCO) 111 based on the attenuated signal. The CDR circuit 110 may include a serial-to-parallel converter 118 configured to convert the received signal or data stream in a serial format into one in a parallel format based on the track clock. The received signal or data stream in the parallel format can be output from the serial-to-parallel converter 118.

Referring to FIG. 2A, the divider (Div) 128 may divide the frequency of the track clock from the voltage-controlled oscillator (VCO) 111 so as to generate a divided track clock to a multiplexer (MUX) 120 of the data transceiver 100. Alternatively, the divider (Div) 128 may be omitted such that the track clock from the voltage-controlled oscillator (VCO) 111 may be transmitted to the multiplexer (MUX) 120. The multiplexer (MUX) 120 may select one of the divided track clock or track clock from the divider (Div) 128 or voltage-controlled oscillator (VCO) 111 and the internal clock from the internal oscillator 130 so as to generate the selected clock to a phase lock loop (PLL) 140 of the data transceiver 100. The phase lock loop (PLL) 140 may employ the selected clock as an input to generate a PLL clock having a frequency equal to a multiple of that of the selected clock and synchronize the PLL clock to the clock of the received signal or data stream. The data transceiver 100 may include a controller (CON) 150 configured to generate a digital code based on the PLL clock to a digital-to-analog (D/A) converter 160 of the data transceiver 100. The digital-to-analog (D/A) converter 160 is configured to convert the digital code into an analog signal. The analog signal can be output from the digital-to-analog (D/A) converter 160 to the internal oscillator 130 so as to control or adjust the internal clock of the internal oscillator 130.

Referring to FIGS. 1 and 2A, the data transceiver 100 may include a parallel-to-serial converter 170 configured to convert a transmitting signal or data stream in a parallel format into one in a serial format based on the PLL clock. The transmitting signal or data stream in the serial format at the PLL clock can be output from the parallel-to-serial converter 170 to a transmitting driver 180 of the data transceiver 100. The transmitting driver 180 is configured to drive the transmitting signal or data stream in the serial format at the PLL clock to the electronic host device 20.

Figure 2B:
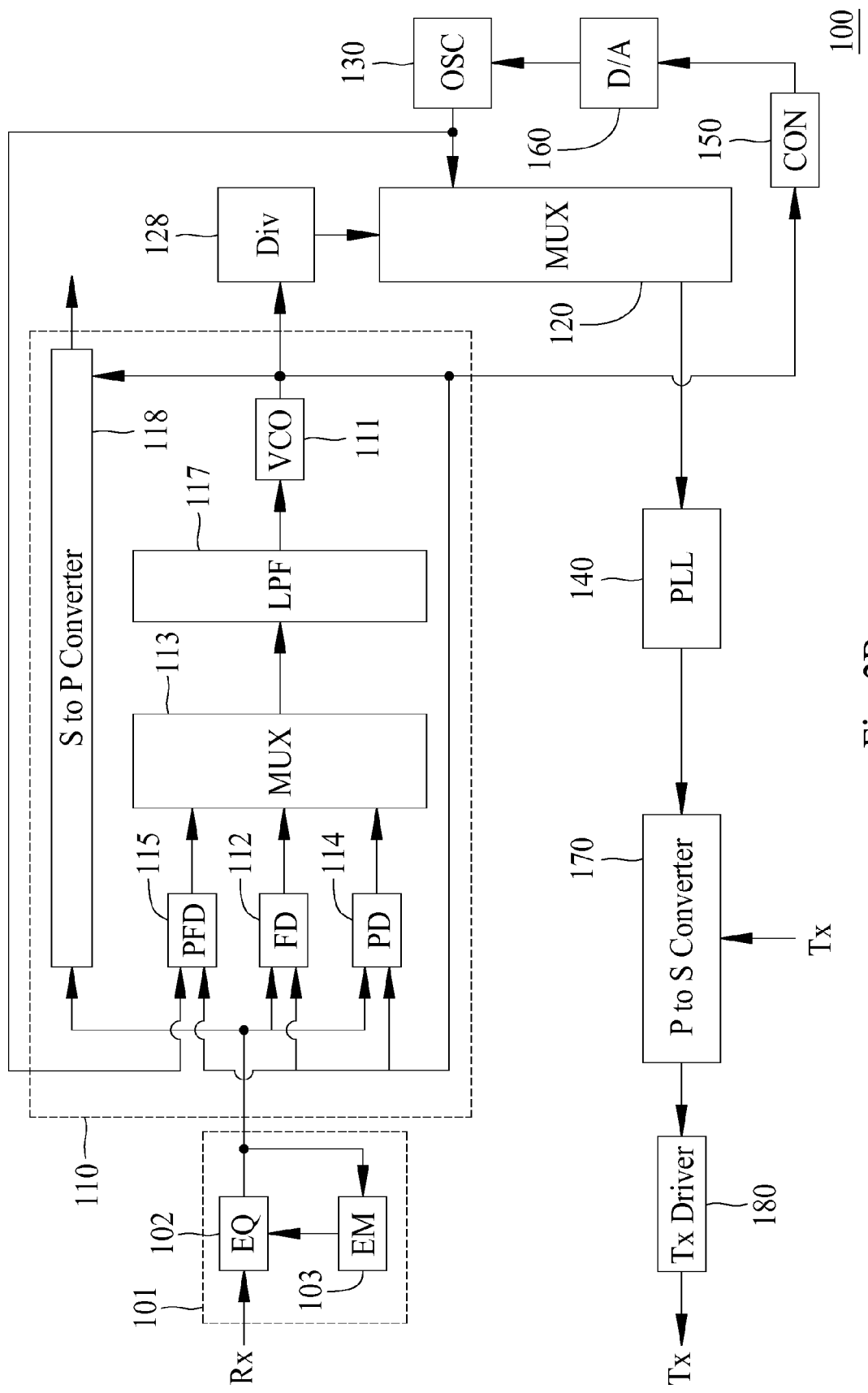
FIG. 2B illustrates a structure of a data transceiver of the electronic portable device in accordance with a second embodiment of the present invention.

FIG. 2B illustrates a structure of a data transceiver of the electronic portable device in accordance with a second embodiment of the present invention. The illustration for FIG. 2B is similar to that for FIG. 2A except that the controller 150 is configured to receive the track clock from the CDR circuit 110 and generate a digital code based on the track clock to the digital-to-analog (D/A) converter 160. An element shown in FIG. 2B having the same reference number as that illustrated in FIG. 2A may be referred to the description for that as illustrated in FIG. 2A.

Figure 2C:
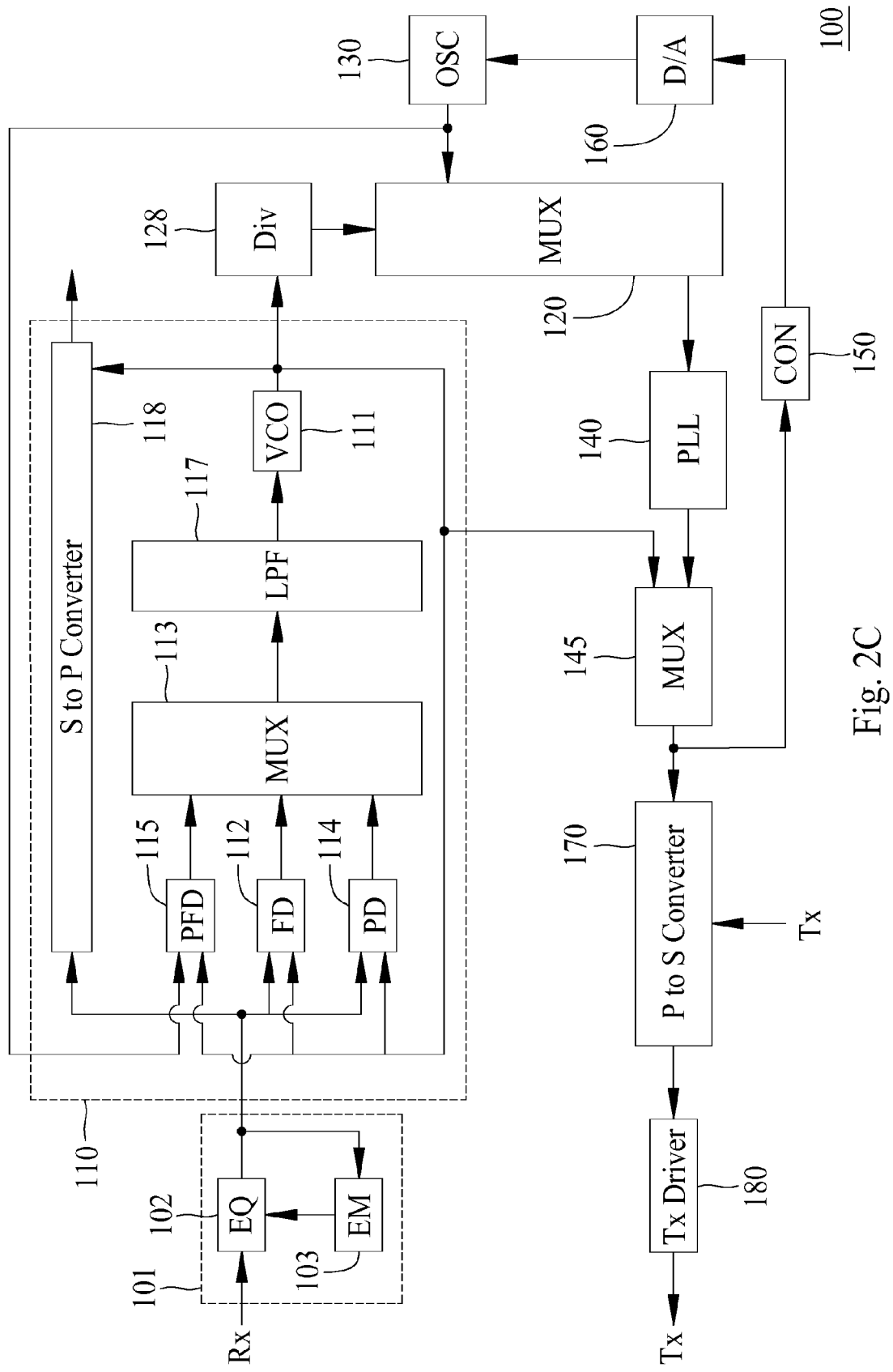
FIG. 2C illustrates a structure of a data transceiver of the electronic portable device in accordance with a third embodiment of the present invention.

FIG. 2C illustrates a structure of a data transceiver of the electronic portable device in accordance with a third embodiment of the present invention. The illustration for FIG. 2C is similar to that for FIG. 2A except that the data transceiver 100 may further include a multiplexer 145 configured to select one of the track clock from the voltage-controlled oscillator (VCO) 111 and the PLL clock from the phase lock loop (PLL) 140 so as to generate a selected clock to the parallel-to-serial converter 170 of the data transceiver 100. The parallel-to-serial converter 170 is configured to convert a transmitting signal or data stream in a parallel format into one in a serial format based on the clock selected by the multiplexer (MUX) 145. The transmitting signal or data stream in the serial format at the clock selected by the multiplexer (MUX) 145 may be output from the parallel-to-serial converter 170 to the transmitting driver 180 of the data transceiver 100. The transmitting driver 180 is configured to drive the transmitting signal or data stream in the serial format at the clock selected by the multiplexer (MUX) 145 to the electronic host device 20. An element shown in FIG. 2C having the same reference number as that illustrated in FIG. 2A may be referred to the description for that as illustrated in FIG. 2A.

Figure 2D:
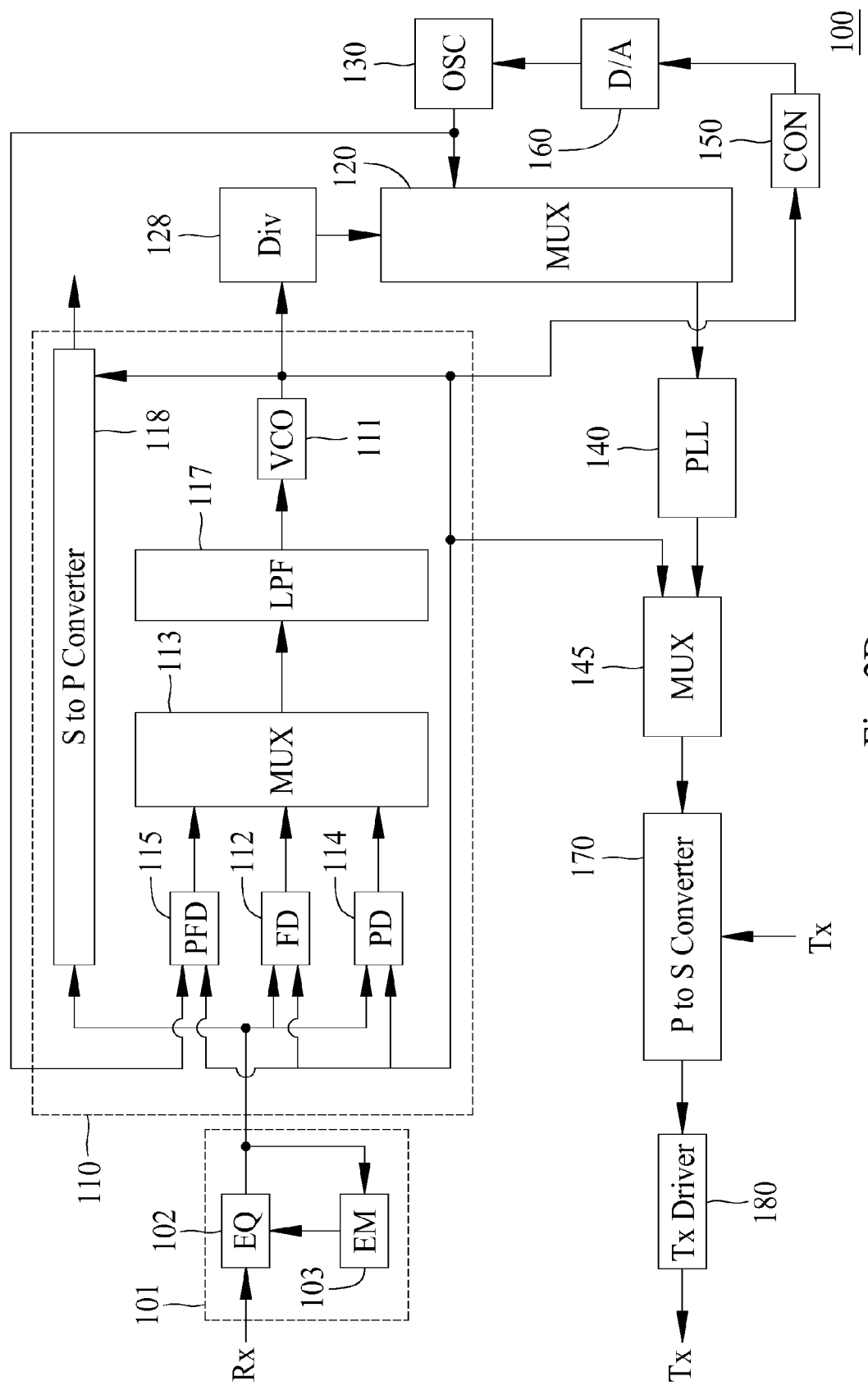
FIG. 2D illustrates a structure of a data transceiver of the electronic portable device in accordance with a fourth embodiment of the present invention.

FIG. 2D illustrates a structure of a data transceiver of the electronic portable device in accordance with a fourth embodiment of the present invention. The illustration for FIG. 2D is similar to that for FIG. 2C except that the controller 150 is configured to receive the track clock from the CDR circuit 110 and generate a digital code based on the track clock to the digital-to-analog (D/A) converter 160. An element shown in FIG. 2D having the same reference number as that illustrated in FIG. 2A or 2C may be referred to the description for that as illustrated in FIG. 2A or 2C.

Figure 2E:
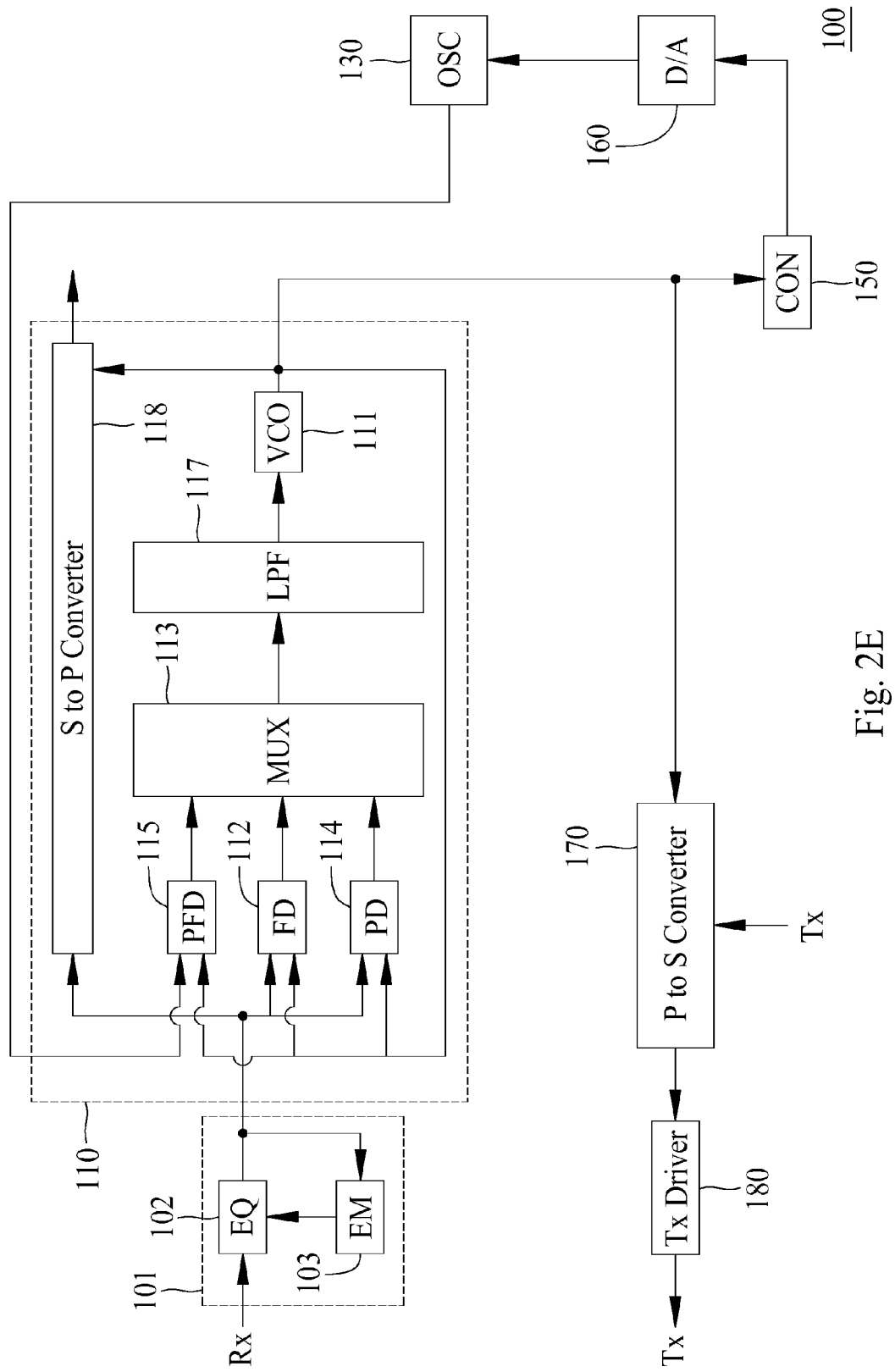
FIG. 2E illustrates a structure of a data transceiver of the electronic portable device in accordance with a fifth embodiment of the present invention.

FIG. 2E illustrates a structure of a data transceiver of the electronic portable device in accordance with a fifth embodiment of the present invention. The illustration for FIG. 2E is similar to that for FIG. 2A except that the multiplexer (MUX) 120, the phase lock loop (PLL) 140 and the divider (Div) 128 may be omitted from the data transceiver 100 illustrated in FIG. 2A. Referring to FIG. 2E, the track clock from the voltage-controlled oscillator (VCO) 111 may be transmitted to the parallel-to-serial converter 170. The parallel-to-serial converter 170 is configured to convert a transmitting signal or data stream in a parallel format into one in a serial format based on the track clock from the voltage-controlled oscillator (VCO) 111. The transmitting signal or data stream in the serial format at the track clock from the voltage-controlled oscillator (VCO) 111 may be output from the parallel-to-serial converter 170 to the transmitting driver 180 of the data transceiver 100. The transmitting driver 180 is configured to drive the transmitting signal or data stream in the serial format at the track clock from the voltage-controlled oscillator (VCO) 111 to the electronic host device 20. Besides, the controller 150 is configured to receive the track clock from the CDR circuit 110 and generate a digital code based on the track clock to the digital-to-analog (D/A) converter 160. An element shown in FIG. 2E having the same reference number as that illustrated in FIG. 2A may be referred to the description for that as illustrated in FIG. 2A.

Figure 3A:
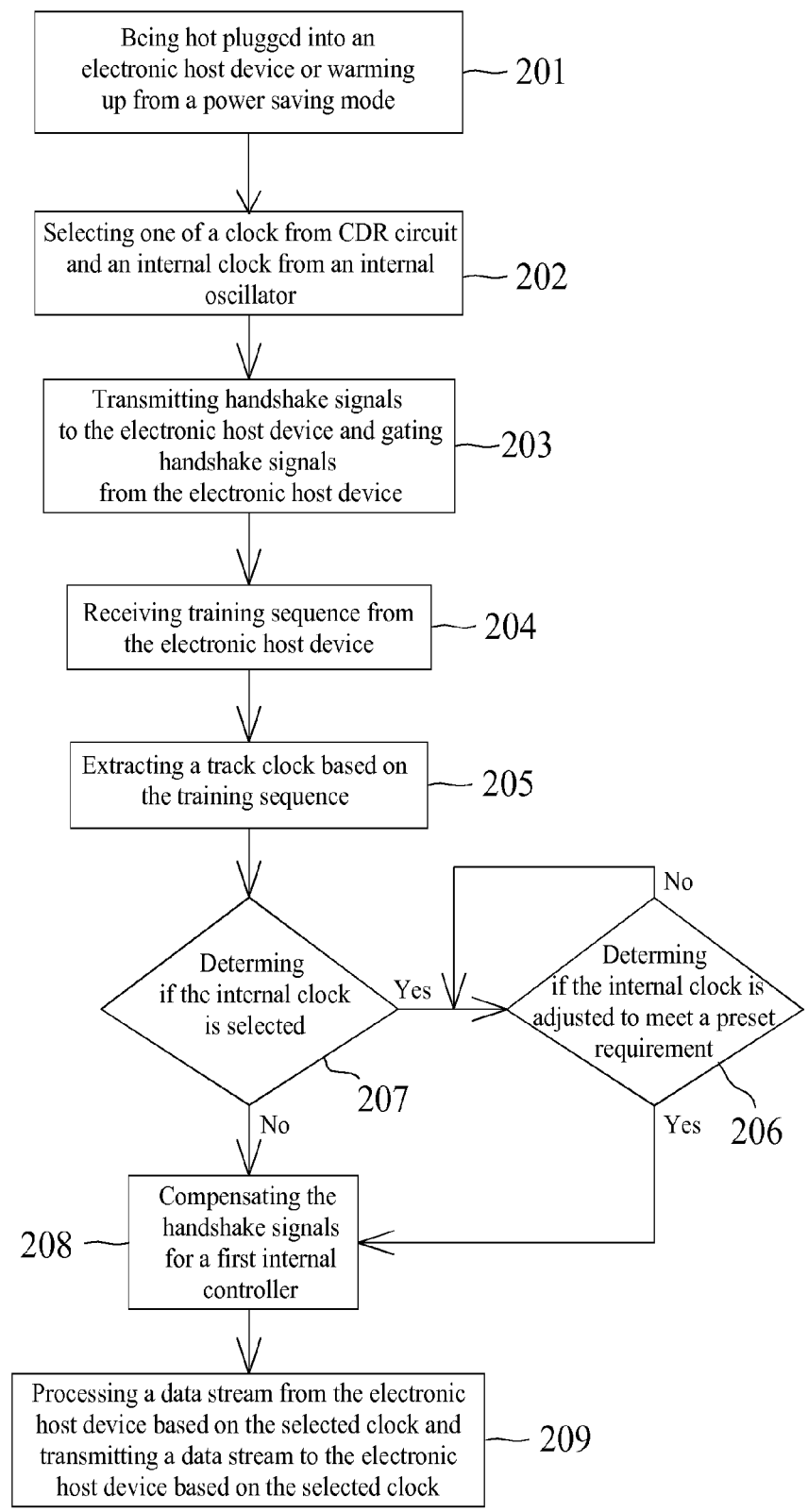
FIG. 3A is a flowchart illustrating a method for an electronic portable device to process data based on clock from an electronic host device in accordance with the present invention.

FIG. 3A is a flowchart illustrating a method for an electronic portable device to process data based on clock from an electronic host device in accordance with the present invention.

Referring to FIGS. 1, 2A-2E and 3A, upon the electronic portable device 10 being hot-plugged into the electronic host device 20 or being warmed up from a power saving mode, as illustrated in step 201, the multiplexer (MUX) 120, as illustrated in step 202, may select one of a clock from the CDR circuit 110 and an internal clock from the internal oscillator 130. In the case of the third and fourth embodiments illustrated in FIGS. 2C and 2D, the multiplexer (MUX) 145 is further provided to select one of the clock from the CDR circuit 110 and a PLL clock from the phase lock loop (PLL) 140.

For a first case, the multiplexer (MUX) 120 selects a clock from the CDR circuit 110, which may be divided by the divider (Div) 128, according to the first and second embodiments as illustrated in FIGS. 2A and 2B. Alternatively, the multiplexer (MUX) 120 selects a clock from the CDR circuit 110, which may be divided by the divider (Div) 128 and the multiplexer (MUX) 145 selects the PLL clock from the phase lock loop (PLL) 140, according to the third and fourth embodiments as illustrated in FIGS. 2C and 2D.

For a second case, the multiplexer (MUX) 120 selects the internal clock from the internal oscillator 130, according to the first and second embodiments as illustrated in FIGS. 2A and 2B. Alternatively, the multiplexer (MUX) 120 selects the internal clock from the internal oscillator 130 and the multiplexer (MUX) 145 selects the PLL clock from the phase lock loop (PLL) 140, according to the third and fourth embodiments as illustrated in FIGS. 2C and 2D.

For a third case, the multiplexer (MUX) 145 select a clock from the CDR circuit 110, according to the third and fourth embodiments as illustrated in FIGS. 2C and 2D.

For a fourth case, the step 202 may be omitted and the clock from the CDR circuit 110, according to the fifth embodiment as illustrated in FIG. 2E, may be transmitted to the parallel-to-serial converter 170 without any selection by any multiplexer (MUX).

Next, referring to FIGS. 1, 2A-2E and 3A, a transmitting handshake signal in a parallel format may be sent to the parallel-to-serial converter 170 to be converted into one in a serial format based on the PLL clock in the first or second case or based on a clock from the CDR circuit 110 in the third or fourth case. The transmitting driver 180 may drive the transmitting handshake signal in the serial format to the electronic host device 20 based on the PLL clock the PLL clock in the first or second case or based on a clock from the CDR circuit 110 in the third or fourth case, as illustrated in step 203.

Referring to FIGS. 1, 2A-2E and 3A, the parallel-to-serial converter 170 may be alternatively powered down, and the transmitting driver 180 may drive a transmitting handshake signal at a clock, with a lower frequency than that of the track clock later extracted by the CDR circuit 110 when receiving the high-frequency receive signal, e.g. a training sequence (TS) or a high-frequency data stream, from the electronic host device 20, generated by a clock generator to the electronic host device 20.

Referring to FIGS. 1, 2A-2E and 3A, simultaneously with generating the transmitting handshake signal, the data transceiver 100 of the electronic portable device 10 may gate a receiving handshake signal at a clock, with a lower frequency than the high-frequency receive signal, e.g. a training sequence (TS) or a high-frequency data stream, later transmitted from the electronic host device 20, from the electronic host device 20 to a first internal controller (not shown) of the electronic portable device 10, as illustrated in step 203. Thereby, the first internal controller may be prevented from sending instructions for subsequent actions.

Referring to FIGS. 1, 2A-2E and 3A, upon receiving the transmitting handshake signal from the electronic portable device 10, the electronic host device 20 may transmit the high-frequency receive signal, e.g. a training sequence (TS) or a high-frequency data stream, at a clock having a frequency higher than that of the receiving handshake signal and higher than that of the transmitting handshake signal, to the electronic portable device 10, as illustrated in step 204. Upon receiving the high-frequency receive signal from the electronic host device 20, the CDR circuit 110 of the electronic portable device 10 may extract the track clock based on the high-frequency receive signal, as illustrated in step 205, wherein the track clock may be output from the voltage-controlled oscillator 111 of the CDR circuit 110 to the divider (Div) 128 or multiplexer (MUX) 120 in the first and second embodiment as illustrated in FIGS. 2A and 2B. Alternatively, the track clock may be output from the voltage-controlled oscillator 111 of the CDR circuit 110 to the divider (Div) 128 or multiplexer (MUX) 120 and to the multiplexer (MUX) 145 in the third and fourth embodiment as illustrated in FIGS. 2C and 2D. Alternatively, the track clock may be output from the voltage-controlled oscillator 111 of the CDR circuit 110 to the parallel-to-serial converter 170 and controller 150 without any selection by any multiplexer (MUX) in the fifth embodiment as illustrated in FIG. 2E.

Meanwhile, referring to FIGS. 1, 2A-2E and 3A, due to the high-frequency receive signal, e.g. a training sequence (TS) or a high-frequency data stream, conforming to a frequency range defined by the specification of the data transceiver 100, the track clock divided by the divider (Div) 128 or output from the CDR circuit 110 also conforms to a frequency range defined by the specification of the data transceiver 100.

Next, referring to FIGS. 1, 2A and 3A, for the first embodiment as illustrated in FIG. 2A, the phase lock loop (PLL) 140 has an input of the track clock, which may be divided by the divider (Div) 128 and passed by the multiplexer (MUX) 120, the PLL clock from the phase lock loop (PLL) 140 may be transmitted to the controller (CON) 150 to be employed to adjust the internal clock of the internal oscillator 130.

Alternatively, referring to FIGS. 1, 2B, 2D, 2E and 3A, for the second, fourth and fifth embodiments as illustrated in FIGS. 2B, 2D and 2E, the track clock from the CDR circuit 110 may be transmitted to the controller (CON) 150 to be employed to adjust the internal clock of the internal oscillator 130.

Alternatively, referring to FIGS. 1, 2C and 3A, for the third embodiment as illustrated in FIG. 2C, the track clock from the CDR circuit 110 may be passed by the multiplexer (MUX) 145 to the controller (CON) 150 to be employed to adjust the internal clock of the internal oscillator 130. Besides, the phase lock loop (PLL) 140 may have an input of the track clock, which may be divided by the divider (Div) 128 and passed by the multiplexer (MUX) 120, the PLL clock from the phase lock loop (PLL) 140 may be passed by the multiplexer (MUX) 145 to the controller (CON) 150 to be employed to adjust the internal clock of the internal oscillator 130.

Referring to FIGS. 1, 2A-2E and 3A, a subsequent step 206 of determining if the internal clock of the internal oscillator 130 is adjusted to meet a preset requirement is performed. When the internal clock of the internal oscillator 130 does not meet the preset requirement, the internal clock of the internal oscillator 130 may be iteratively adjusted. When the internal clock of the internal oscillator 130 meets the preset requirement, the internal clock of the internal oscillator 130 may be stopped to be adjusted.

Referring to FIGS. 1, 2A-2E and 3A, after the track clock is extracted, as illustrated in step 205, a step 207 of determining if the multiplexer (MUX) 120 selects the internal clock of the internal oscillator 130, according to the first and second embodiments as illustrated in FIGS. 2A and 2B, or determining if the multiplexer (MUX) 120 selects the internal clock of the internal oscillator 130 and the multiplexer (MUX) 145 selects the PLL clock from the phase lock loop (PLL) 140, according to the third and fourth embodiments as illustrated in FIGS. 2C and 2D, is performed. According to the first and second embodiments as illustrated in FIGS. 2A and 2B, when the multiplexer (MUX) 120 selects the internal clock of the internal oscillator 130, as illustrated in step 207, and when the internal clock of the internal oscillator 130 is adjusted to meet the preset requirement, as illustrated in step 206, step 208 continues; otherwise, the internal clock of the internal oscillator 130 is iteratively adjusted. Alternatively, according to the third and fourth embodiments as illustrated in FIGS. 2C and 2D, when the multiplexer (MUX) 120 selects the internal clock of the internal oscillator 130 and the multiplexer (MUX) 145 selects the PLL clock from the phase lock loop (PLL) 140, as illustrated in step 207, and when the internal clock of the internal oscillator 130 is adjusted to meet the preset requirement, as illustrated in step 206, step 208 continues; otherwise, the internal clock of the internal oscillator 130 is iteratively adjusted. At this time, the phase lock loop (PLL) 140 may generate the PLL clock having a frequency equal to a multiple of that of the clock selected by the multiplexer (MUX) 120, i.e. the internal clock of the internal oscillator 130, and synchronize the PLL clock to the clock of the high-frequency receive signal, e.g. a training sequence (TS) or a high-frequency data stream. The PLL clock may have substantially the same frequency and phase as the clock of the high-frequency receive signal from the electronic host device 20 because the internal clock of the internal oscillator 130 is iteratively adjusted to be precise based on the track clock as illustrated in step 206. Alternatively, according to the fifth embodiment as illustrated in FIG. 2E, the step 207 may be omitted, i.e. after the step 205 of extracting the track clock based on the high-frequency receive signal is finished, step 208 continues.

Referring to FIGS. 1, 2A-2D and 3A, for the step 207, according to the first and second embodiments as illustrated in FIGS. 2A and 2B, when the multiplexer (MUX) 120 selects the track clock from the CDR circuit 110, which may be divided by the divider (Div) 128, step 208 continues. Alternatively, for the step 207, according to the third and fourth embodiments as illustrated in FIGS. 2C and 2D, when the multiplexer (MUX) 120 selects the track clock from the CDR circuit 110, which may be divided by the divider (Div) 128, and the multiplexer (MUX) 145 selects the PLL clock from the phase lock loop (PLL) 140, step 208 continues. It is noted that the phase lock loop (PLL) 140 may generate the PLL clock having a frequency equal to a multiple of that of the clock selected by the multiplexer (MUX) 120, i.e. the track clock from the CDR circuit, which may be divided by the divider (Div) 128, and synchronize the PLL clock to the clock of the high-frequency receive signal, e.g. a training sequence (TS) or a high-frequency data stream. The PLL clock may have substantially the same frequency and phase as the clock of the high-frequency receive signal from the electronic host device 20. Alternatively, for the step 207, according to the third and fourth embodiments as illustrated in FIGS. 2C and 2D, when the multiplexer (MUX) 145 selects the track clock from the CDR circuit 110, step 208 continues.

Referring to FIGS. 1, 2A-2E and 3A, when the electronic portable device 10 receives a signal or data stream from the electronic host device 20, the data transceiver 100 in accordance with the first, second, third or fourth embodiment, as illustrated in FIG. 2A, 2B, 2C or 2D, may be switched to (1) operating as illustrated for the case 1 to process data based on the PLL clock derived from the track clock passed by the multiplexer (MUX) 120, wherein the PLL clock may be alternatively further passed by the multiplexer (MUX) 145 according to the third and fourth embodiments as illustrated in FIGS. 2C and 2D, and (2) operating for the case 2 to process data based on the PLL clock derived from the internal clock passed by the multiplexer (MUX) 120, wherein the PLL clock may be alternatively further passed by the multiplexer (MUX) 145 according to the third and fourth embodiments as illustrated in FIGS. 2C and 2D. Alternatively, when the electronic portable device 10 receives a signal or data stream from the electronic host device 20, the data transceiver 100 in accordance with the third or fourth embodiment, as illustrated in FIG. 2C or 2D, may be switched to operating as illustrated for the case 3 to process data based on the track clock passed by the multiplexer (MUX) 145. Alternatively, when the electronic portable device 10 receives a signal or data stream from the electronic host device 20, the data transceiver 100 in accordance with the fifth embodiment, as illustrated in FIG. 2E, may be switched to operating as illustrated for the case 4 to process data based on the track clock.

When the electronic portable device 10 is switched to a power saving mode, where the electronic portable device 10 does not receive a signal or data stream from the electronic host device 20, the data transceiver 100 in accordance with the first, second, third or fourth embodiment, as illustrated in FIG. 2A, 2B, 2C or 2D, may be switched to operating as illustrated for the case 2 to process data based on the PLL clock derived from the internal clock generated by the internal oscillator 130 passed by the multiplexer (MUX) 120 according to the first through fourth embodiments as illustrated in FIGS. 2A-2D, wherein the PLL clock may be alternatively further passed by the multiplexer (MUX) 145 according to the third and fourth embodiments as illustrated in FIGS. 2C and 2D. Alternatively, when the electronic portable device 10 is switched to the power saving mode, the data transceiver 100 in accordance with the fifth embodiment, as illustrated in FIG. 2E, may be switched to processing data based on the internal clock generated by the internal oscillator 130. In the power saving mode, the signal conditioning circuit 101, i.e. including the eye monitor 103 and the equalizer 102, and CDR circuit 110 may be turned off and the phase lock loop (PLL) 140 and parallel-to-serial converter 170 may be turned on; alternatively, in the power saving mode, the signal conditioning circuit 101, i.e. including the eye monitor 103 and the equalizer 102, CDR circuit 110 and parallel-to-serial converter 170 may be turned off and the phase lock loop (PLL) 140 may be turned on.

Referring to FIGS. 1, 2A-2E and 3A, in step 208, the first internal controller may be compensated with the receiving handshake signal, that is, a compensating handshake signal, substantially the same as the receiving handshake signal, may be generated, by a second internal controller (not shown) of the electronic portable device 10, to be transmitted to the first internal controller of the electronic portable device 10. The first internal controller after compensated by the receiving handshake signal may send instructions for subsequent actions mentioned as below. For example, the electronic portable device 10 may process a data stream from the electronic host device 20 based on the PLL clock, which is generated by the phase lock loop (PLL) 140 based on the clock selected by the multiplexer (MUX) 120 for the first or second case as illustrated in step 202, on the track clock passed by the multiplexer (MUX) 145 for the third case as illustrated in step 202, or on the track clock for the fourth case and/or transmit a data stream to the electronic host device 20 based on the PLL clock, which is generated by the phase lock loop (PLL) 140 based on the clock selected by the multiplexer (MUX) 120 for the first or second case as illustrated in step 202, on the track clock passed by the multiplexer (MUX) 145 for the third case as illustrated in step 202, or on the track clock for the fourth case, wherein the PLL clock may have substantially the same frequency and phase as the clock of the data stream from the electronic host device 20, as illustrated in step 209.

Referring to FIGS. 1, 2A-2E and 3A, when the track clock is selected by the multiplexer (MUX) 120 to be output to the phase lock loop (PLL) 140 as illustrated in step 202 for the first case, the PLL clock output from the phase lock loop (PLL) 140 in the first and third embodiments as illustrated in FIGS. 2A and 2C passed by the multiplexer (MUX) 145 to the controller (CON) 150 or the track clock output from the CDR circuit 110 in the second and fourth embodiments as illustrated in FIGS. 2B and 2D may be received by the controller (CON) 150. When the internal clock from the internal oscillator 130 is selected by the multiplexer (MUX) 120 to be output to the phase lock loop (PLL) 140 as illustrated in step 202 for the second case, the track clock output from the CDR circuit 110 in the second and fourth embodiments as illustrated in FIGS. 2B and 2D may be received by the controller (CON) 150. When the track clock is selected by the multiplexer (MUX) 145 as illustrated in step 202 for the third case, the track clock output from the CDR circuit 110 in the first and third embodiments as illustrated in FIGS. 2A and 2C may be passed by the multiplexer (MUX) 145 to the controller (CON) 150, or the track clock output from the CDR circuit 110 in the second and fourth embodiments as illustrated in FIGS. 2B and 2D may be received by the controller (CON) 150. For the fourth case, the track clock output from the CDR circuit 110 in the fifth embodiment as illustrated in FIG. 2E may be received by the controller (CON) 150.

For the first case, the controller (CON) 150 may generate a digital code, based on the PLL clock in the first embodiment as illustrated in FIG. 2A, on the PLL clock passed by the multiplexer (MUX) 145 in the third embodiment as illustrated in FIG. 2C or on the track clock in the second or fourth embodiment as illustrated in FIG. 2B or 2D, to the digital-to-analog (D/A) converter 160.

For the second case, the controller (CON) 150 may generate a digital code, based on the track clock in the second or fourth embodiment as illustrated in FIG. 2B or 2D, to the digital-to-analog (D/A) converter 160.

For the third case, the controller (CON) 150 may generate a digital code, based on the track clock passed by the multiplexer (MUX) 145 in the third embodiment as illustrated in FIG. 2C or on the track clock in the fourth embodiment as illustrated in FIG. 2D, to the digital-to-analog (D/A) converter 160.

For the fourth case, the controller (CON) 150 may generate a digital code, based on the track clock in the fifth embodiment as illustrated in FIG. 2E, to the digital-to-analog (D/A) converter 160.

Next, referring to FIGS. 1, 2A-2E and 3A, the digital-to-analog (D/A) converter 160 may convert the digital code into an analog signal. The analog signal can be output from the digital-to-analog (D/A) converter 160 to the internal oscillator 130 so as to adjust the internal clock of the internal oscillator 130. Thereby, the adjusted internal clock from the internal oscillator 130 may be selected by the multiplexer (MUX) 120 when the electronic portable device 10 is in the power saving mode.

Alternatively, referring to FIGS. 1, 2A-2D and 3A, when the electronic portable device 10 is warmed up from the power saving mode, the above step of gating the receiving handshake signal from the electronic host device 20 to the first internal controller of the electronic portable device 10 and the step 208 of compensating the first internal controller with the receiving handshake signal may be omitted.

Figure 3B:
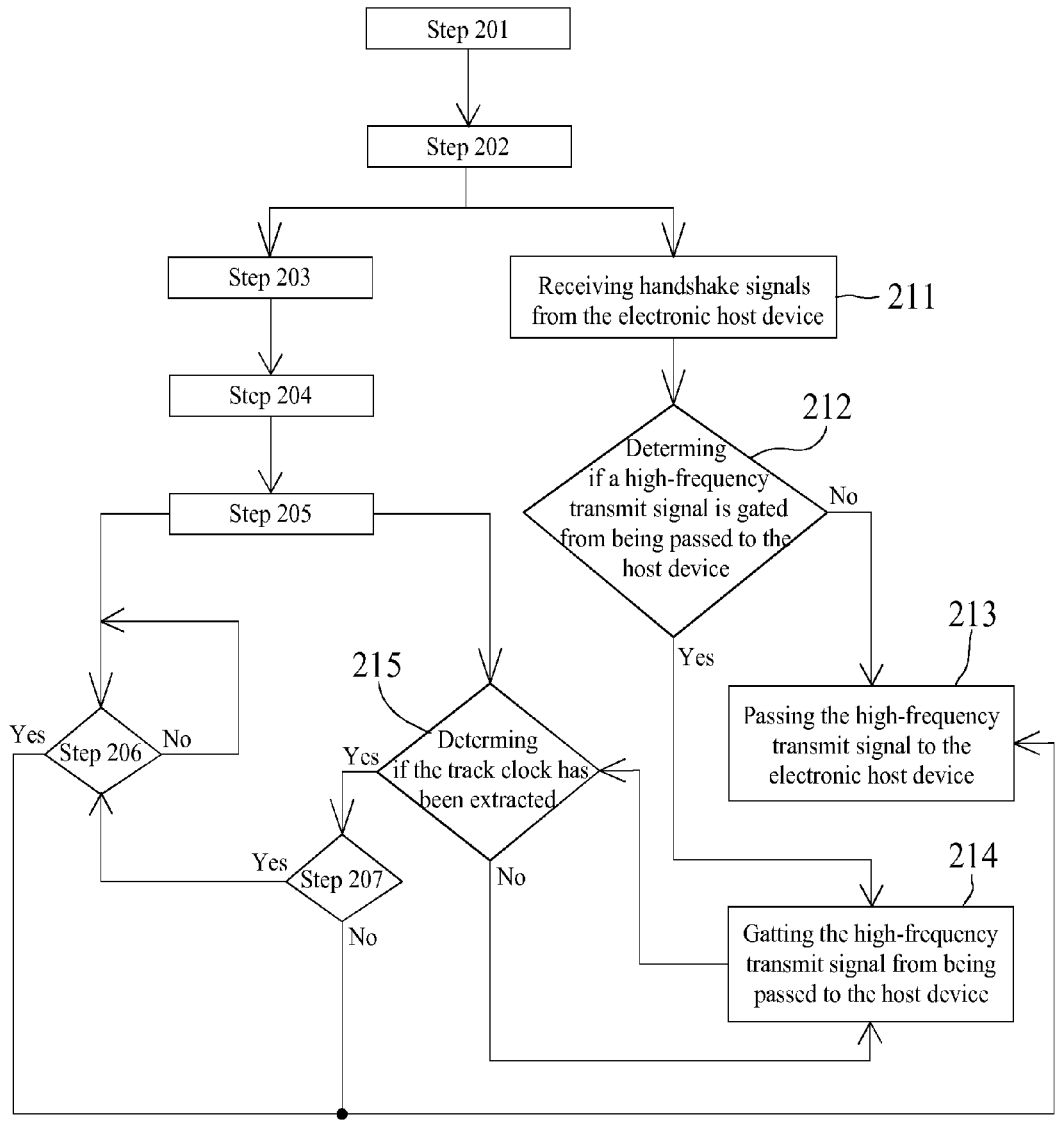
FIG. 3B is a flowchart illustrating another method for an electronic portable device to transmit data to an electron host device based on clock from the electronic host device in accordance with the present invention.

Alternatively, FIG. 3B is a flowchart illustrating another method for the electronic portable device to transmit data to the electronic host device based on clock from the electronic host device in accordance with the present invention. A step shown in FIG. 3B having the same reference number as that illustrated in FIG. 3A may be referred to the description for that as illustrated in FIG. 3A.

Referring to FIGS. 1, 2A-2E and 3B, after the step 202, the first controller of the data transceiver 100 may receive a receiving handshake signal at a clock, with a lower frequency than the high-frequency receive signal, e.g. a training sequence (TS) or a high-frequency data stream, later transmitted from the electronic host device 20, from the electronic host device 20, as illustrated in step 211. It is noted that the step 203 illustrated in the FIG. 3B is similar with the step 203 illustrated in the FIG. 3A except that the step of gating the receiving handshake signal from the electronic host device 20 to the first internal controller of the electronic portable device 10 is omitted in the step 203 illustrated in the FIG. 3B. A subsequent step 212 of determining if a high-frequency transmit signal generated by the first controller of the data transceiver 100 should be gated from being transmitted to the electronic host device 20 is performed. When determined not to be gated from being transmitted to the electronic host device 20, the high-frequency transmit signal generated by the first controller of the data transceiver 100 based on the clock selected according to the step 202 may be passed to the electronic host device 20, as illustrated in step 213. Otherwise, the high-frequency transmit signal generated by the first controller of the data transceiver 100 may be gated from being transmitted to the electronic host device 20, as illustrated in step 214.

Referring to FIGS. 1, 2A-2E and 3B, when the high-frequency transmit signal generated by the first controller of the data transceiver 100 is determined to be gated from being transmitted to the electronic host device 20, as illustrated in step 214, a subsequent step 215 of determining if the track clock has been extracted in step 205, is performed. If the track clock is determined to have been extracted, as illustrated in step 215, the above-mentioned step 207 continues according to the first through fourth embodiments as illustrated in FIGS. 2A-2D. Alternatively, according to the fifth embodiment as illustrated in FIG. 2E, the steps 206 and 207 may be omitted, i.e. if the track clock is determined to have been extracted, as illustrated in step 215, the step 213 of passing the high-frequency transmit signal generated by the first controller of the data transceiver 100 based on the track clock to the electronic host device 20 continues. If the track clock is determined not to have been extracted yet, as illustrated in step 215, the above-mentioned step 214 of gating the high-frequency transmit signal generated by the first controller of the data transceiver 100 from being transmitted to the electronic host device 20 continues.

Referring to FIGS. 1, 2A-2D and 3B, according to the first and second embodiments as illustrated in FIGS. 2A and 2B, when the multiplexer (MUX) 120 selects the internal clock of the internal oscillator 130, as illustrated in step 207, and when the internal clock of the internal oscillator 130 is adjusted to meet the preset requirement, as illustrated in step 206, the step 213 of passing the high-frequency transmit signal generated by the first controller of the data transceiver 100 based on the clock selected according to the step 202 to the electronic host device 20 continues; otherwise, the internal clock of the internal oscillator 130 is iteratively adjusted and the step 214 of gating the high-frequency transmit signal generated by the first controller of the data transceiver 100 from being transmitted to the electronic host device 20 continues. Alternatively, according to the third and fourth embodiments as illustrated in FIGS. 2C and 2D, when the multiplexer (MUX) 120 selects the internal clock of the internal oscillator 130 and the multiplexer (MUX) 145 selects the PLL clock from the phase lock loop (PLL) 140, as illustrated in step 207, and when the internal clock of the internal oscillator 130 is adjusted to meet the preset requirement, as illustrated in step 206, the step 213 of passing the high-frequency transmit signal generated by the first controller of the data transceiver 100 based on the clock selected according to the step 202 to the electronic host device 20 continues; otherwise, the internal clock of the internal oscillator 130 is iteratively adjusted and the step 214 of gating the high-frequency transmit signal generated by the first controller of the data transceiver 100 from being transmitted to the electronic host device 20 continues. At this time, the phase lock loop (PLL) 140 may generate the PLL clock having a frequency equal to a multiple of that of the clock selected by the multiplexer (MUX) 120, i.e. the internal clock of the internal oscillator 130, and synchronize the PLL clock to the clock of the high-frequency receive signal, e.g. a training sequence (TS) or a high-frequency data stream. The PLL clock may have substantially the same frequency and phase as the clock of the high-frequency receive signal from the electronic host device 20 because the internal clock of the internal oscillator 130 is iteratively adjusted to be precise based on the track clock as illustrated in step 206.

Referring to FIGS. 1, 2A-2D and 3B, for the step 207, according to the first and second embodiments as illustrated in FIGS. 2A and 2B, when the multiplexer (MUX) 120 selects the track clock from the CDR circuit 110, which may be divided by the divider (Div) 128, the step 213 of passing the high-frequency transmit signal generated by the first controller of the data transceiver 100 based on the clock selected according to the step 202 to the electronic host device 20 continues. Alternatively, for the step 207, according to the third and fourth embodiments as illustrated in FIGS. 2C and 2D, when the multiplexer (MUX) 120 selects the track clock from the CDR circuit 110, which may be divided by the divider (Div) 128, and the multiplexer (MUX) 145 selects the PLL clock from the phase lock loop (PLL) 140, the step 213 of passing the high-frequency transmit signal generated by the first controller of the data transceiver 100 based on the clock selected according to the step 202 to the electronic host device 20 continues. It is noted that the phase lock loop (PLL) 140 may generate the PLL clock having a frequency equal to a multiple of that of the clock selected by the multiplexer (MUX) 120, i.e. the track clock from the CDR circuit, which may be divided by the divider (Div) 128, and synchronize the PLL clock to the clock of the high-frequency receive signal, e.g. a training sequence (TS) or a high-frequency data stream. The PLL clock may have substantially the same frequency and phase as the clock of the high-frequency receive signal from the electronic host device 20. Alternatively, for the step 207, according to the third and fourth embodiments as illustrated in FIGS. 2C and 2D, when the multiplexer (MUX) 145 selects the track clock from the CDR circuit 110, the step 213 of passing the high-frequency transmit signal generated by the first controller of the data transceiver 100 based on the clock selected according to the step 202 to the electronic host device 20 continues.

Figure 4:
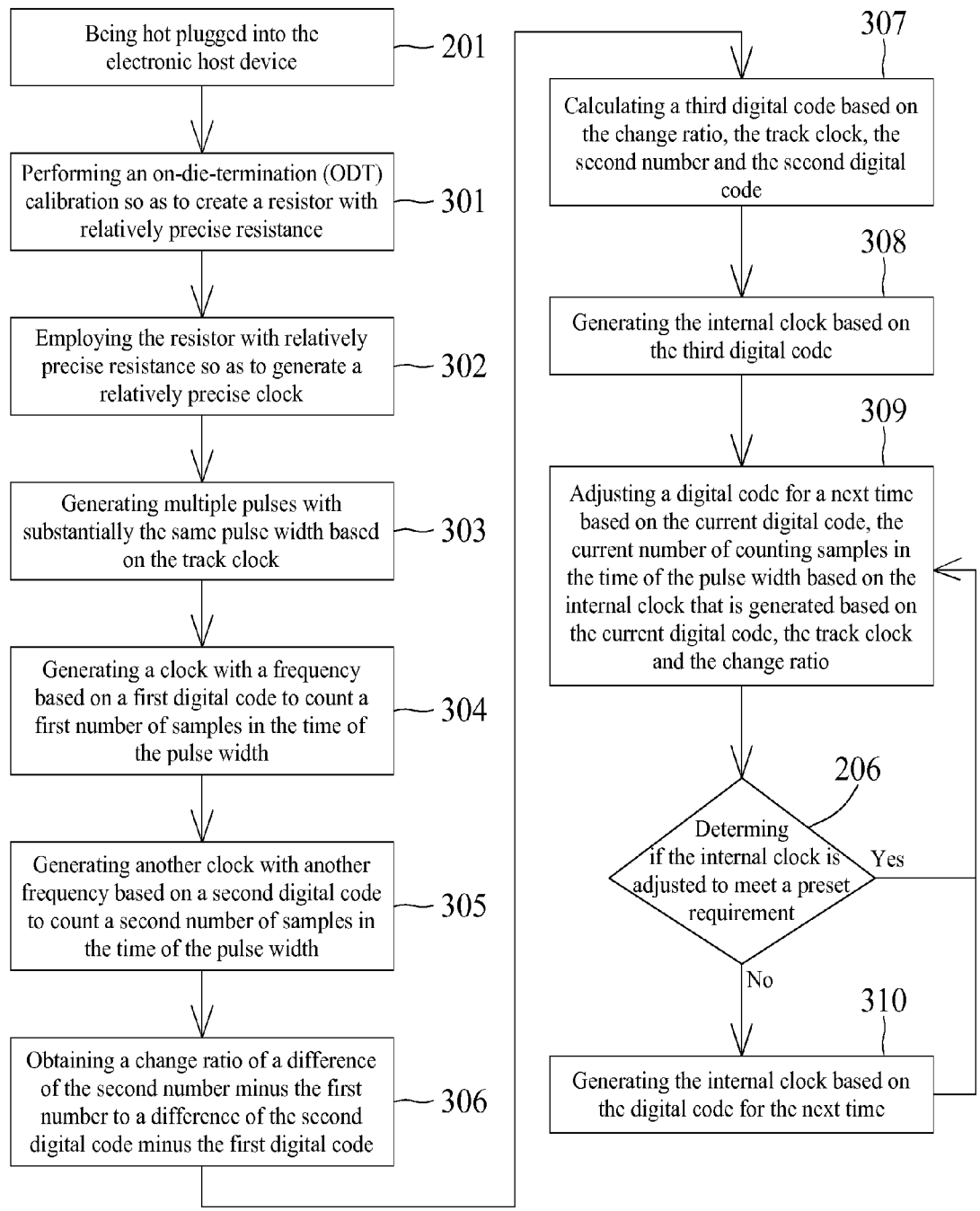
FIG. 4 is a flowchart illustrating a method for adjusting the internal clock of the internal oscillator in accordance with the present invention.
Figure 5:
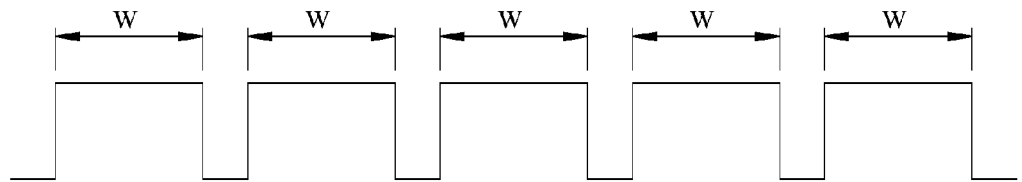
FIG. 5 is a diagram showing multiple pulses having substantially the same pulse width in accordance with the present invention.
Figure 6:
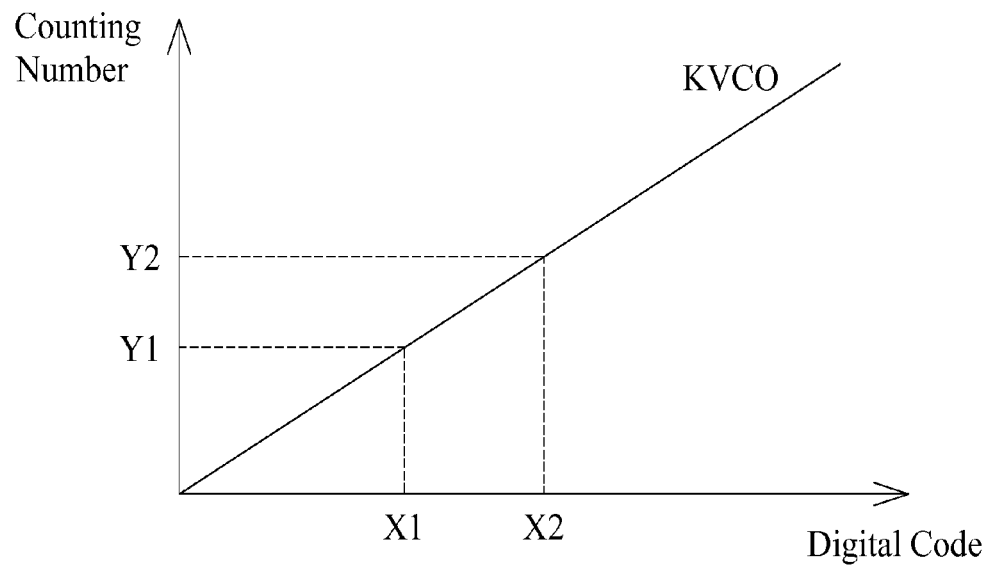
FIG. 6 is a diagram showing the relation between the counting number of the internal oscillator in the time of the pulse width and the digital code input to the digital-to-analog (D/A) converter to be converted into the analog signal that is input to the internal oscillator in accordance with the present invention.

The above step of adjusting the internal clock of the internal oscillator 130 is further discussed as below. FIG. 4 is a flowchart illustrating a method for adjusting the internal clock of the internal oscillator in accordance with the present invention when the electronic portable device 10 continuously receives the high-frequency receive signal, e.g. a training sequence (TS) or a high-frequency data stream, from the electronic host device 20. FIG. 5 is a diagram showing multiple pulses having substantially the same pulse width in accordance with the present invention. FIG. 6 is a diagram showing the relation between the counting number of the internal oscillator in the time of the pulse width and the digital code input to the digital-to-analog (D/A) converter to be converted into the analog signal that is input to the internal oscillator in accordance with the present invention.

Referring to FIGS. 1, 2A-2E, 3 and 4, upon the electronic portable device 10 is hot-plugged into the electronic host device 20 as illustrated in step 201, the internal oscillator 130 may employ a first resistor with inaccurate resistance, that is, variations of resistance in a range from −25% of a precise resistance to 25% of the precise resistance so as to output a clock having inaccurate frequency, that is, variations of frequency in a range from −30% of the frequency of the track clock to 30% of the frequency of the track clock. Initially, the variations of frequency are targeted to be reduced to a range from −10% of the frequency of the track clock to 10% of the frequency of the track clock via an on-die-termination (ODT) calibration. During the on-die-termination (ODT) calibration, a second resistor has resistance that can be adjusted into the precise resistance, as illustrated in step 301, such that signal reflection from the electronic portable device 10 to the electronic host device 20 can be reduced. After the resistance of the second resistor is adjusted into the precise resistance, that is, the signal reflection is reduced to be optimal, the first resistor can be replaced with the second resistor or with a portion of the second resistor. Thereby, the internal oscillator 130 may employ the second resistor or a portion of the second resistor with the precise resistance, as illustrated in step 302, to generate a calibrated clock having variations of frequency in a range from −10% of the frequency of the track clock to 10% of the frequency of the track clock.

Referring to FIGS. 2A-2E, 3, 4 and 5, after the calibrated clock is generated by the internal oscillator 130 as illustrated in step 302 and after the track clock is extracted by the CDR circuit 110 as illustrated in step 206 in FIG. 3, multiple pulses having substantially the same pulse width w may be generated based on the track clock, as illustrated in step 303.

Referring to FIGS. 2A-2E, 4, 5 and 6, after the pulses are generated, the internal oscillator 130 may generate a clock with a frequency based on a first preset digital code $X_1$, input at the first time to the digital-to-analog converter 160 to be converted into a first analog signal sent to the internal oscillator 130, to count a first number $Y_1$ of samples in the time of the pulse width w, as illustrated in step 304. Next, the internal oscillator 130 may further generate another clock with another frequency based on a second preset digital code $X_2$, input at the second time to the digital-to-analog converter 160 to be converted into a second analog signal sent to the internal oscillator 130, to count a second number $Y_2$ of samples in the time of the pulse width w, as illustrated in step 305.

Next, referring to FIGS. 4 and 6, upon obtaining the first and second counting numbers $Y_1$ and $Y_2$ and the first and second preset digital codes $X_1$ and $X_2$, in accordance with equation (1), a change ratio of KVCO can be obtained by dividing a difference of the second counting number $Y_2$ minus the first counting number $Y_1$ by a difference of the second preset digital code $X_2$ minus the first preset digital code $X_1$, as illustrated in step 306.

$$KVCO = \frac{Y_2 - Y_1}{X_2 - X_1} \quad (1)$$

Next, referring to FIGS. 4, 5 and 6, upon obtaining the ratio KVCO, in accordance with equation (2), a third digital code $X_3$ may be obtained by adding the second digital code $X_2$ with a value obtained by dividing the subtraction of the second number $Y_2$ of counting samples from the target number $Y_t$ of counting samples by the ratio of KVCO, where $Y_t$ is the target number of counting samples in the time of the pulse width w based on the track clock, as illustrated in step 307.

$$X_3 = \frac{Y_t - Y_2}{KVCO} + X_2 \quad (2)$$

Next, referring to FIGS. 2A-2E, 4 and 6, the third digital code $X_3$ can be output from the controller (CON) 150 to the digital-to-analog (D/A) converter 160 to be converted into a third analog signal. The internal oscillator 130 may generate the internal clock based on the third analog signal, as illustrated in step 308.

Due to long-term signal jitter, temperature change, power change and/or quantization error, the internal clock may become inaccurate so as to be adjusted in accordance with equation (3).

$$X_{n+1} = \frac{Y_t - Y_n}{KVCO} + X_n \quad (3)$$

Where, $X_{n+1}$ is a digital code, which will be input at the $n+1^{th}$ time to the digital-to-analog converter 160 to be converted into an analog signal sent to the internal oscillator 130, wherein n is greater than or equal to 3;

$X_n$ is a digital code, which has been input at the $n^{th}$ time to the digital-to-analog converter 160 to be converted into an analog signal sent to the internal oscillator 130, wherein n is greater than or equal to 3;

$Y_n$ is a number of counting samples in the time of the pulse width w based on the internal clock that is generated by the internal oscillator 130 based on the digital code $X_n$, wherein n is greater than or equal to 3;

$Y_t$ is the target number of counting samples in the time of the pulse width w based on the track clock; and KVCO is the above-mentioned change ratio.

Accordingly, a digital code for a next time may be adjusted based on the current digital code, the current counting number, the counting number $Y_t$ calculated based on the track clock and the change ratio KVCO in accordance with equation (3), as illustrated in step 309. Thereafter, the above-mentioned step 206 of determining if the internal clock of the internal oscillator 130 is adjusted to meet a preset requirement is performed. When the internal clock of the internal oscillator 130 meets the preset requirement, the step 309 continues. When the internal clock of the internal oscillator 130 does not meet the preset requirement, the internal clock can be generated based on the digital code for the next time, as illustrated in step 310. The step 309 can be continuously and iteratively repeated and thereby the internal clock output from the internal oscillator 130 may approach to the track clock from the CDR circuit 110 and the inaccuracy of the internal clock due to the long-term signal jitter, temperature change, power change and/or quantization error may be compensated.

Figure 7:
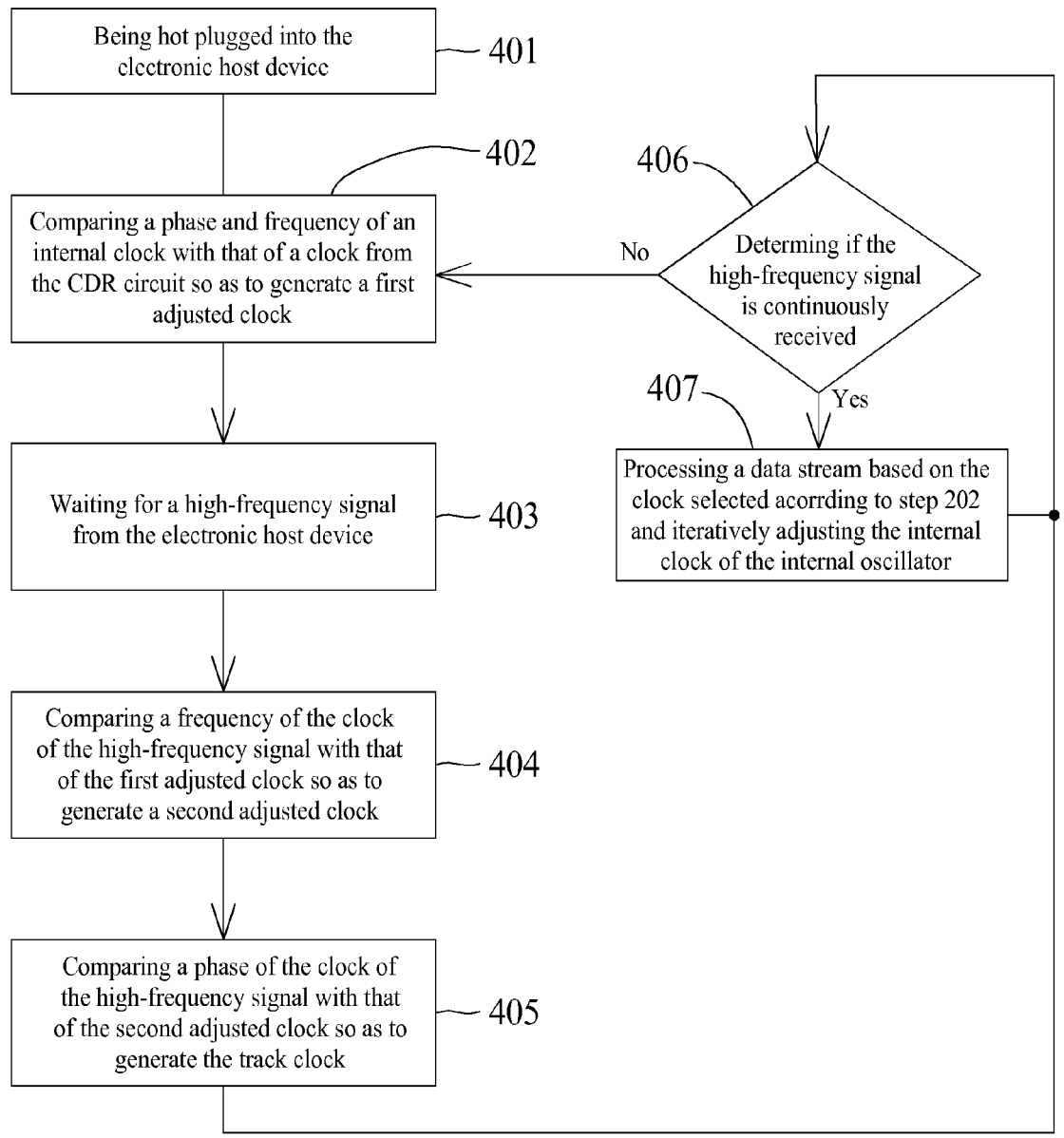
FIG. 7 is a flowchart illustrating a method for tracking the clock of the high-frequency receive signal, e.g. a training sequence or a high-frequency data stream, upon the electronic portable device being hot-plugged into the electronic host device in accordance with the present invention.

FIG. 7 is a flowchart illustrating a method for tracking the clock of the high-frequency receive signal, e.g. a training sequence (TS) or a high-frequency data stream, upon the electronic portable device 10 being hot-plugged into the electronic host device 20 in accordance with the present invention. Referring to FIGS. 1, 2A-2E and 7, for promptly tracking the clock of the high-frequency receive signal from the electronic host device 20, the CDR circuit 110 may receive the internal clock from the internal oscillator 130 upon the electronic portable device 10 being hot-plugged into the electronic host device 20 as illustrated in step 401, where the internal clock has a phase and frequency to be compared by the phase-and-frequency detector (PFD) 115 of the CDR circuit 110 with those of a clock generated by the voltage-controlled oscillator (VCO) 111 so as to generate a phase-and-frequency-compared result. The phase-and-frequency-compared result generated by the phase-and-frequency detector (PFD) 115 may be selected by the multiplexer (MUX) 113 and may have frequencies higher than a cutoff frequency to be then filtered by the low-pass filter (LPF) 117. The voltage-controlled oscillator (VCO) 111 may then generate a first adjusted clock based on the phase-and-frequency-compared result, as illustrated in step 402.

Next, referring to FIGS. 1, 2A-2E and 7, the CDR circuit 110 waits for the high-frequency receive signal, e.g. a training sequence (TS) or a high-frequency data stream, transmitted from the electronic host device 20, as illustrated in step 403. Upon the CDR circuit 110 receiving the high-frequency receive signal from the equalizer (EQ) 102, the frequency detector (FD) 112 of the CDR circuit 110 may compare a frequency of the high-frequency receive signal with that of the first adjusted clock so as to generate a frequency-compared result. The frequency-compared result may be selected by the multiplexer (MUX) 113 and may have frequencies higher than a cutoff frequency to be then filtered by the low-pass filter (LPF) 117. The voltage-controlled oscillator (VCO) 111 may then generate a second adjusted clock based on the frequency-compared result, as illustrated in step 404. Next, the phase detector (PD) 114 of the CDR circuit 110 may compare a phase of the high-frequency receive signal with that of the second adjusted clock so as to generate a phase-compared result. The phase-compared result may be selected by the multiplexer (MUX) 113 and may have frequencies higher than a cutoff frequency to be then filtered by the low-pass filter (LPF) 117. The voltage-controlled oscillator (VCO) 111 may then generate the track clock based on the phase-compared result, as illustrated in step 405.

Thereby, referring to FIGS. 1, 2A-2E, 3A, 3B and 7, the CDR circuit 110 may promptly generate the track clock upon the electronic portable device 10 being hot-plugged into the electronic host device 20. As illustrated in step 406, upon the high-frequency receive signal determined by the eye monitor (EM) 103 not to be received by the electronic portable device 10, the CDR circuit 110 may loop back to perform the step 402. At this time, for the case 1, data may be processed based on the PLL clock derived from the first adjusted clock passed by the multiplexer (MUX) 120 according to the first through fourth embodiments as illustrated in FIGS. 2A-2D, wherein the PLL clock may be alternatively further passed by the multiplexer (MUX) 145 according to the third and fourth embodiments as illustrated in FIGS. 2C and 2D; for the case 3, data may be processed based on the first adjusted clock passed by the multiplexer (MUX) 145; for the case 4, data may be processed based on the first adjusted clock according to the fifth embodiment as illustrated in FIG. 2E. Upon the high-frequency receive signal determined by the eye monitor (EM) 103 to be continuously received by the electronic portable device 10, the electronic portable device 10, as illustrated in step 407, may process a data stream from the electronic host device 20 based on the PLL clock, which is generated by the phase lock loop (PLL) 140 based on the clock selected by the multiplexer (MUX) 120 for the first or second case as illustrated in step 202 in FIGS. 3A and 3B, on the track clock passed by the multiplexer (MUX) 145 for the third case as illustrated in step 202 in FIGS. 3A and 3B or on the track clock output from the CDR circuit 110 for the fourth case in the fifth embodiment, i.e. in FIG. 2E, and/or iteratively adjust the internal clock of the internal oscillator 130 based on the PLL clock in the first or third embodiment, i.e. in FIG. 2A or 2C, or the track clock in the second or fourth embodiment, i.e. in FIG. 2B or 2D, for the first case, on the track clock in the second or fourth embodiment, i.e. in FIG. 2B or 2D, for the second case, on the track clock passed by the multiplexer (MUX) 145 in the third embodiment, i.e. in FIG. 2C, for the third case or the track clock in the fourth embodiment, i.e. in FIG. 2D, for the third case, or on the track clock in the fifth embodiment, i.e. in FIG. 2E, for the fourth case, as illustrated in the step 206 in FIGS. 3A and 3B.

Figure 8:
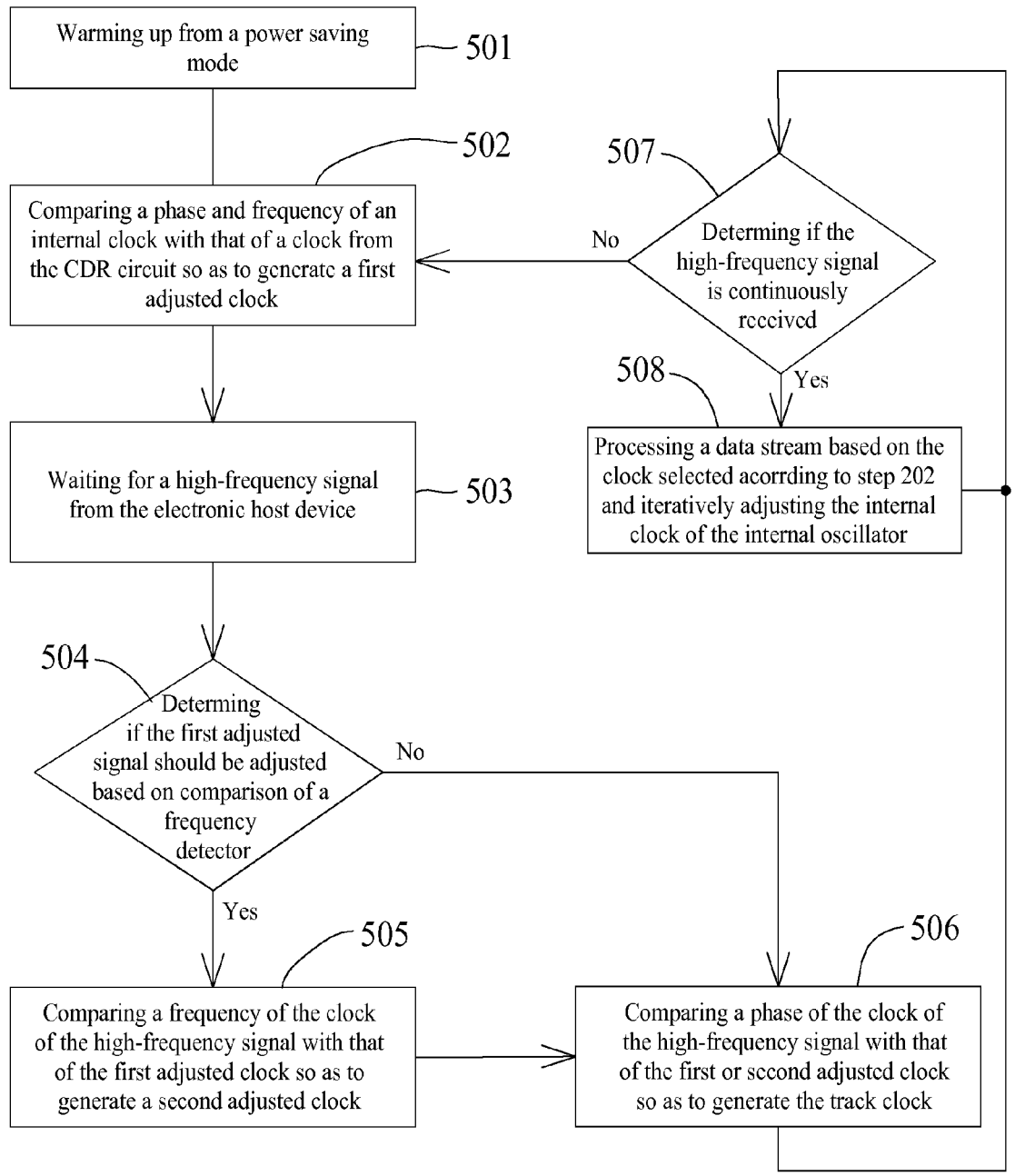
FIG. 8 is a flowchart illustrating a method for tracking the clock of the high-frequency receive signal, e.g. a training sequence or a high-frequency data stream, upon the electronic portable device being waken up from a power saving mode.

FIG. 8 is a flowchart illustrating a method for tracking the clock of the high-frequency receive signal, e.g. a training sequence or a high-frequency data stream, upon the electronic portable device 10 warming up from a power saving mode. Referring to FIGS. 1, 2A-2E and 8, the CDR circuit 110 may receive the internal clock from the internal oscillator 130 upon the electronic portable device 10 being waken up from a power saving mode as illustrated in step 501, where the internal clock has a phase and frequency to be compared by the phase-and-frequency detector (PFD) 115 of the CDR circuit 110 with those of a clock generated by the voltage-controlled oscillator (VCO) 111 so as to generate a phase-and-frequency-compared result. The phase-and-frequency-compared result generated by the phase-and-frequency detector (PFD) 115 may be selected by the multiplexer (MUX) 113 and may have frequencies higher than a cutoff frequency to be then filtered by the low-pass filter (LPF) 117. The voltage-controlled oscillator (VCO) 111 may then generate a first adjusted clock based on the phase-and-frequency-compared result, as illustrated in step 502.

Next, referring to FIGS. 1, 2A-2E and 8, the CDR circuit 110 waits for the high-frequency receive signal, e.g. a training sequence (TS) or a high-frequency data stream, transmitted from the electronic host device 20, as illustrated in step 503. Upon the CDR circuit 110 receiving the high-frequency receive signal, the first adjusted clock has a frequency that may be compared by the frequency detector (FD) 112 with that of the high-frequency receive signal so as to determine if the first adjusted clock should be adjusted, as illustrated in step 504.

Referring to FIGS. 1, 2A-2E and 8, when the first adjusted clock is determined to be adjusted based on the comparison from the frequency detector (FD) 112 in step 504, the frequency detector (FD) 112 of the CDR circuit 110 may compare a frequency of the high-frequency receive signal with that of the first adjusted clock so as to generate a frequency-compared result. The frequency-compared result may be selected by the multiplexer (MUX) 113 and may have frequencies higher than a cutoff frequency to be then filtered by the low-pass filter (LPF) 117. The voltage-controlled oscillator (VCO) 111 may then generate a second adjusted clock based on the frequency-compared result, as illustrated in step 505. Next, the phase detector (PD) 114 of the CDR circuit 110 may compare a phase of the high-frequency receive signal with that of the second adjusted clock so as to generate a phase-compared result. The phase-compared result may be selected by the multiplexer (MUX) 113 and may have frequencies higher than a cutoff frequency to be then filtered by the low-pass filter (LPF) 117. The voltage-controlled oscillator (VCO) 111 may then generate the track clock based on the phase-compared result, as illustrated in step 506.

Alternatively, when the first adjusted clock is determined not to be adjusted based on the comparison from the frequency detector (FD) 112 in step 504, the above step 505 may be skipped. The phase detector (PD) 114 of the CDR circuit 110 may compare a phase of the high-frequency receive signal with that of the first adjusted clock so as to generate a phase-compared result. The phase-compared result may be selected by the multiplexer (MUX) 113 and may have frequencies higher than a cutoff frequency to be then filtered by the low-pass filter (LPF) 117. The voltage-controlled oscillator (VCO) 111 may then generate the track clock based on the phase-compared result, as illustrated in step 506.

Thereby, referring to FIGS. 1, 2A-2E, 3A, 3B and 8, the CDR circuit 110 may promptly generate the track clock upon the electronic portable device 10 warming up from the power saving mode. As illustrated in step 507, upon the high-frequency receive signal determined by the eye monitor (EM) 103 not to be received by the electronic portable device 10, the CDR circuit 110 may loop back to perform the step 502. At this time, for the case 1, data may be processed based on the PLL clock derived from the first adjusted clock passed by the multiplexer (MUX) 120 according to the first through fourth embodiments as illustrated in FIGS. 2A-2D, wherein the PLL clock may be alternatively further passed by the multiplexer (MUX) 145 according to the third and fourth embodiments as illustrated in FIGS. 2C and 2D; for the case 3, data may be processed based on the first adjusted clock passed by the multiplexer (MUX) 145; for the case 4, data may be processed based on the first adjusted clock according to the fifth embodiment as illustrated in FIG. 2E. Upon the high-frequency receive signal determined by the eye monitor (EM) 103 to be continuously received by the electronic portable device 10, the electronic portable device 10, as illustrated in step 508, may process a data stream from the electronic host device 20 based on the PLL clock, which is generated by the phase lock loop (PLL) 140 based on the clock selected by the multiplexer (MUX) 120 for the first or second case as illustrated in step 202 in FIGS. 3A and 3B, or on the track clock passed by the multiplexer (MUX) 145 for the third case as illustrated in step 202 in FIGS. 3A and 3B or on the track clock output from the CDR circuit 110 for the fourth case in the fifth embodiment, i.e. in FIG. 2E, and/or iteratively adjust the internal clock of the internal oscillator 130 based on the PLL clock in the first or third embodiment, i.e. in FIG. 2A or 2C, or the track clock in the second or fourth embodiment, i.e. in FIG. 2B or 2D, for the first case, on the track clock in the second or fourth embodiment, i.e. in FIG. 2B or 2D, for the second case, on the track clock passed by the multiplexer (MUX) 145 in the third embodiment, i.e. in FIG. 2C, for the third case or the track clock in the fourth embodiment, i.e. in FIG. 2D, for the third case, or on the track clock in the fifth embodiment, i.e. in FIG. 2E, for the fourth case, as illustrated in step 206 in FIGS. 3A and 3B.

Accordingly, in accordance with the present invention, referring to FIGS. 1 and 2A-2E, the high-frequency receive signal, e.g. a training sequence or a high-frequency data stream, from the electronic host device 20 has a clock, from which the track clock may be extracted by the CDR circuit 110. When the electronic portable device 10 receives the high-frequency receive signal from the electronic host device 20, the track clock may be employed to process a data stream from the electronic host device 20, transmit a data stream to the electronic host device 20 and/or adjust the internal oscillator 130 to generate the internal clock having a frequency approaching to that of the track clock. When the electronic portable device 10 is in the power saving mode, the internal clock having been adjusted to meet the preset requirement may be employed as a reference clock to process a data stream or signal. Thereby, even if a crystal is saved in the electronic portable device 10, the electronic portable device 10 may generate an accurate clock, that is, the track clock or the internal clock.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A method for a first electronic device processing data based on information from a second electronic device, comprising:
   receiving a first signal at a first clock from said second electronic device;
   receiving a second signal from said second electronic device;
   extracting a second clock based on said second signal, wherein said second clock has a frequency greater than that of said first clock;
   compensating said first signal to an internal controller of said first electronic device;
   adjusting an oscillator based on said second clock so as to generate a third clock; and
   selecting one from said second and third clocks.

2. The method of claim 1, wherein said first electronic device is configured to be hot plugged into said second electronic device.

3. The method of claim 1, wherein said adjusting said oscillator comprises said oscillator generating a fourth clock based on a first code, counting a first number of samples in an interval of time based on said fourth clock, said oscillator generating a fifth clock based on a second code, counting a second number of samples in said interval of time based on said fifth clock, obtaining a ratio of a difference of said second number minus said first number to a difference of said second code minus said first code, counting a third number of samples in said interval of time based on said second clock, and calculating a third code based on said ratio, said second code and said second and third numbers.

4. The method of claim 3, wherein said adjusting said oscillator further comprises generating multiple pulses with substantially the same pulse width, wherein said interval of time is substantially equal to the time of said pulse width.

5. The method of claim 3, wherein said adjusting said oscillator further comprises generating a sixth clock based on said third code, counting a fourth number of samples in said interval of time based on said sixth clock, and generating a fourth code based on said third code, said ratio and said third and fourth numbers.

6. The method of claim 1, wherein said adjusting said oscillator comprises replacing a resistor for said oscillator.

7. The method of claim 1, after said adjusting said oscillator, further comprising entering into a power saving mode, followed by said selecting said third clock.

8. The method of claim 1, after said compensating said first signal to said internal controller of said first electronic device, further comprising transmitting a data stream to said second electronic device based on said selecting said one from said second and third clocks.

9. The method of claim 1, after said compensating said first signal to said internal controller of said first electronic device, further comprising processing a data stream from said second electronic device based on said selecting said one from said second and third clocks.

10. The method of claim 1, before said receiving said second signal, further comprising transmitting a third signal at a fourth clock, with a frequency less than that of said second clock, to said second electronic device.

11. The method of claim 1, before said extracting said second clock, further comprising gating a third signal from being transmitted to said second electronic device.

12. A method for a first electronic device processing data based on information from a second electronic device, comprising:
   receiving a first signal from said second electronic device;
   extracting a first clock based on said first signal; and
   adjusting an oscillator based on said first clock, wherein said adjusting said oscillator comprises said oscillator generating a second clock based on a first code, counting a first number of samples in an interval of time based on said second clock, said oscillator generating a third clock based on a second code, counting a second number of samples in said interval of time based on said third clock, obtaining a ratio of a difference of said second number minus said first number to a difference of said second code minus said first code, and calculating a third code based on said ratio, said second code and said second number and said first clock.

13. The method of claim 12, wherein said adjusting said oscillator further comprises generating multiple pulses with substantially the same pulse width, wherein said interval of time is substantially equal to the time of said pulse width.

14. The method of claim 12, wherein said adjusting said oscillator further comprises generating a fourth clock based on said third code, counting a third number of samples in said interval of time based on said fourth clock, and generating a fourth code based on said third code, said ratio, said third number and said first clock.

15. The method of claim 12, wherein said adjusting said oscillator further comprises replacing a resistor for said oscillator.

16. The method of claim 12, wherein said first electronic device is configured to be hot plugged into said second electronic device.

17. A method for a first electronic device processing data based on information from a second electronic device, comprising:
receiving a first signal from said second electronic device;
extracting a first clock based on said first signal;
adjusting an oscillator based on said first clock so as to generate a second clock, wherein said adjusting said oscillator comprises said oscillator generating a third clock based on a first code, counting a first number of samples in an interval of time based on said third clock, said oscillator generating a fourth clock based on a second code, counting a second number of samples in said interval of time based on said fourth clock, obtaining a ratio of a difference of said second number minus said first number to a difference of said second code minus said first code, counting a third number of samples in said interval of time based on said first clock, and calculating a third code based on said ratio, said second code and said second and third numbers; and
selecting one from said first and second clocks.

18. The method of claim 17, wherein said adjusting said oscillator further comprises generating multiple pulses with substantially the same pulse width, wherein said interval of time is substantially equal to the time of said pulse width.

19. The method of claim 17, wherein said adjusting said oscillator further comprises generating a fifth clock based on said third code, counting a fourth number of samples in said interval of time based on said fifth clock, and generating a fourth code based on said third code, said ratio and said third and fourth numbers.

20. The method of claim 17, wherein said adjusting said oscillator further comprises replacing a resistor for said oscillator.

* * * * *